United States Patent
Leary et al.

(10) Patent No.: US 7,123,638 B2
(45) Date of Patent: Oct. 17, 2006

(54) TUNNEL-JUNCTION STRUCTURE INCORPORATING N-TYPE LAYER COMPRISING NITROGEN AND A GROUP VI DOPANT

(75) Inventors: Michael Howard Leary, Mountain View, CA (US); Danny E. Mars, Los Altos, CA (US); Sungwon David Roh, San Jose, CA (US); Danielle R. Chamberlin, San Mateo, CA (US); Ying-Lan Chang, Cupertino, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 361 days.

(21) Appl. No.: 10/688,600

(22) Filed: Oct. 17, 2003

(65) Prior Publication Data
US 2005/0083979 A1 Apr. 21, 2005

(51) Int. Cl.
H01S 3/04 (2006.01)
H01L 29/24 (2006.01)
H01L 31/0336 (2006.01)

(52) U.S. Cl. .................. 372/43.01; 257/25; 257/104
(58) Field of Classification Search .. 372/43.01–44.01, 372/92, 98–99; 257/25, 104
See application file for complete search history.

(56) References Cited
U.S. PATENT DOCUMENTS 5,689,123 A * 11/1997 Major et al. ............... 257/190
6,724,013 B1 * 4/2004 Kneissl et al. ............... 257/79
6,765,238 B1 * 7/2004 Chang et al. ............... 257/104
6,771,680 B1 * 8/2004 Bour et al. .............. 372/43.01
6,813,293 B1 * 11/2004 Johnson et al. ......... 372/46.015
6,852,614 B1 * 2/2005 Compaan et al. ........... 438/603
7,034,331 B1 * 4/2006 Chang et al. ................ 257/25
2004/0076209 A1 * 4/2004 Bour et al. .................. 372/45
2004/0161013 A1 * 8/2004 Bour et al. .................. 372/96
2004/0217343 A1 * 11/2004 Chang et al. ................ 257/25
2005/0105576 A1 * 5/2005 Kim ........................... 372/44

OTHER PUBLICATIONS

R. Shau et al., Vertical-cavity Surface-emitting Laser Diodes at 1.55-μm With Large Output Power and High Operation Temperature, *Electronics Letters, Oct. 11, 2001*, vol. 37 No. 21 (1295).

(Continued)

*Primary Examiner*—James Menefee
*Assistant Examiner*—Phillip Nguyen

(57) ABSTRACT

A tunnel junction structure comprises an n-type tunnel junction layer of a first semiconductor material, a p-type tunnel junction layer of a second semiconductor material and a tunnel junction between the tunnel junction layers. The first semiconductor material includes gallium (Ga), nitrogen (N), arsenic (As) and is doped with a Group VI dopant. The probability of tunneling is significantly increased, and the voltage drop across the tunnel junction is consequently decreased, by forming the tunnel junction structure of materials having a reduced difference between the valence band energy of the material of the p-type tunnel junction layer and the conduction band energy of the n-type tunnel junction layer. Doping the first semiconductor material n-type with a Group VI dopant maximizes the doping concentration in the first semiconductor material, thus further improving the probability of tunneling.

23 Claims, 6 Drawing Sheets

OTHER PUBLICATIONS

S. Nakagawa et al., 1.55-μm InP-Lattice-Matched VCSELs With AlGaAsSb-AlAsSb DBRs, *IEEE Journal on Selected Topics in Quantum Electronics*, vol. 7, No. 2, Mar./Apr. 2001, 224-230.

Chao-Kun Lin et al. High Temperature Continuous-Wave Operation of 1.3-1.55 -μm VCSELs With InP/Air-Gap DBRs.

J. J. Wierer, et al., Lateral Electron Current Operation of Vertical Cavity Surface Emitting Lasers With Buried Tunnel Contact Hole Sources, *Appl. Phys. Lett.*, vol. 71, No. 24, Dec. 15, 1997, 3468-3470.

K. D. Choquette, et al., Room Temperature Continuous Wave InGaAsN Quantum Well Vertical-Cavity Lasers Emitting at 1.3 μm, *Electronics Letters*, Aug. 2000, vol. 36, No. 16, 1388-1390.

K. M. Yu et al., Nitrogen-Induced Increase of the Maximum Electron Concentration in Group III-N-V Alloys, *The American Physical Society*, Physical Review B, vol. 61, No. 20, May 15, 2000, 337-340.

K. M. Yu, et al., Mutual Passivation of Electrically Active and Isovalent Impurities, *Nature Publishing Group*, Advance Online Publication, 1-5.

W. Shan, et al., Effect of Nitrogen on the Electronic Band Structure of Group III-N-V Alloys, *The American Physical Society*, Physical Review B, vol. 62, No. 7, Aug. 15, 2000.

K. M. Yu, et al., Mutual Passivation of Group IV Donors and Nitrogen In Diluted $GaN_x As_{1-x}$ Alloys.

* cited by examiner

TUNNEL-JUNCTION STRUCTURE INCORPORATING N-TYPE LAYER COMPRISING NITROGEN AND A GROUP VI DOPANT

BACKGROUND OF THE INVENTION

Semiconductor lasers generate light that can be used in optical communication systems, compact disc (CD) players, digital videodisc (DVD) players, scanners and other systems. Semiconductor lasers for optical communications include vertical-cavity surface-emitting lasers (VCSELs), edge-emitting lasers, in-plane emitting lasers and the like.

Until recently, relatively expensive Fabry-Perot (FP) and distributed-feedback (DFB) lasers have been used to generate light at the wavelengths presently used in the telecommunication industry for transmission via fiber-optic links. Although VCSEL technology has proven to be a viable lower-cost, lower-power alternative well suited for short-haul network applications, had difficulty to produce reliable, cost-effective VCSELs for use at the longer wavelengths used in medium- and long-haul fiber-optic communications links.

A VCSEL is composed of an active region sandwiched between vertically-stacked mirrors, commonly known as distributed Bragg reflectors (DBRs) or Bragg mirrors. The active region typically includes quantum wells that generate the light. The quantum wells are composed of thin layers of semiconductor materials that differ in band-gap energy. To achieve the necessary reflectivity, the number of semiconductor or dielectric layers constituting each of the DBRs can be quite large. The VCSEL emits the light generated in the active region through one of the mirrors, which has a reflectivity less than that of the other of the mirrors. Light is output from a VCSEL from a relatively small area on the surface of the semiconductor, directly above or below the active region.

The potential for VCSELs to generate light with relatively long wavelengths has not been realized due, in part, to the difficulty of epitaxially growing DBRs that have suitable optical, electrical, and thermal properties on an indium phosphide (InP) substrate. Two of the more significant problems are high optical losses and high joule heating in the Bragg mirror fabricated using p-type semiconductor materials.

There has been considerable interest in long wavelength VCSELs on gallium arsenide (GaAs) substrates because of the mature fabrication process for VCSELs operating at 850 nm. It has been found that adding nitrogen (N) to gallium indium arsenide (GaInAs) reduces the energy band gap enough to extend the wavelength to 1300 nm and continue to take advantage of the favorable DBR mirror technology available on GaAs substrates. However, high optical loss in p-type material is a problem.

The industry has explored incorporating a tunnel junction into a VCSEL to address these problems. Incorporating a tunnel junction allows both DBRs to be fabricated using n-type semiconductor materials. A DBR fabricated using n-type semiconductor materials has significantly lower optical losses and higher electrical conductivity than a DBR fabricated using p-type semiconductor material. Reduced optical losses lead to a lower threshold current and a correspondingly higher differential gain. Higher differential gain is an important parameter for achieving high-bandwidth modulation. High-bandwidth modulation is desirable for optical fiber-based communication systems.

FIG. 1 shows a side view of an example of a prior-art semiconductor device 100 incorporating a tunnel junction structure 112. The tunnel junction structure is composed of an n-type tunnel junction layer 104, a p-type tunnel junction layer 106 and a tunnel junction 110 between the tunnel junction layers. The n-type tunnel junction layer is a layer of an n-type semiconductor material. The p-type tunnel junction layer is a layer of a p-type semiconductor material. Applying a reverse bias across tunnel junction 110 will cause a tunneling current to flow across the tunnel junction. A reverse bias is applied by setting n-type tunnel junction layer 104 to a more positive voltage than p-type tunnel junction layer 106. It is desirable to minimize the voltage drop across the tunnel junction to reduce the overall voltage drop across the VCSEL. To minimize the voltage drop across the tunnel junction, conventional approaches have focused on maximizing the doping concentrations in the materials of the tunnel junction layers.

Also shown in FIG. 1 are n-type layer 102 on which n-type tunnel junction layer 104 is grown and p-type layer 108 grown on p-type tunnel junction layer 106; n-type layer 102 may constitute the substrate of semiconductor device 100. Alternatively, n-type layer 102 may be grown on or over the substrate.

Many different pairs of semiconductor materials that can be used as the materials of n-type tunnel junction layer 104 and of p-type tunnel junction layer 106 are known in the art. In the semiconductor device 100 illustrated in FIG. 1, the semiconductor material of n-type tunnel junction layer 104 is n-type GaAs or GaInAs and the semiconductor material of p-type tunnel junction layer 106 is GaAs or GaInAs. If GaInAs is used in either or both of the layers 104 and 106, the In concentration and/or the thickness of the tunnel junction layers should be sufficiently small so that the critical thickness is not exceeded. The critical thickness is the thickness at which crystal defects begin to form due to a mismatch in the lattice parameters of the materials. The material of layer 102 is also n-type GaAs that has a lower dopant concentration than the material of n-type tunnel junction layer 104. The material of layer 108 is also p-type GaAs that has a lower dopant concentration than the material of p-type tunnel junction layer 106.

Tunnel junctions having a low voltage drop are formed of materials that establish a large built-in electrostatic field across the tunnel junction. A large electrostatic field requires a large potential difference across a short distance, and is typically generated by using very high doping concentrations in the tunnel junction layers that minimize the width of the depletion region at the tunnel junction.

FIGS. 2A and 2B each include an energy diagram 200 and an electrical circuit model 202 that show some of the characteristics of tunnel junction structure 102. FIG. 2A shows the characteristics of the tunnel junction structure at equilibrium. FIG. 2B shows the characteristics of the tunnel junction structure under reverse bias. Each energy diagram shows the conduction band energy $E_{C_n}$ and the valence band energy $E_{V_n}$ of the semiconductor material of n-type tunnel junction layer 104. Each energy diagram also shows the conduction band energy $E_{C_p}$ and the valence band energy $E_{V_p}$ of the semiconductor material of p-type tunnel junction layer 106; n-type tunnel junction layer 104 and p-type tunnel junction layer 106 collectively form tunnel junction 110.

The energy diagram of FIG. 2A shows the depletion region 204 that exists at tunnel junction 110 at equilibrium. At equilibrium, the Fermi level $E_{F_n}$ of the material of n-type tunnel junction layer is equal to the Fermi level $E_{F_p}$ of the material of p-type tunnel junction layer 106. The conduction bands of the materials of the tunnel junction layers differ in energy, which establishes the built-in potential barrier 206 at the tunnel junction that prevents conduction through the tunnel junction at low forward bias. The electrostatic field strength E at the tunnel junction depends on the height of the built-in potential barrier and depends inversely on the width W of the depletion region 204 at the tunnel junction.

A forward bias applied across tunnel junction 110 decreases the height of the built-in potential barrier at the tunnel junction. Sufficient forward bias causes current to flow across the tunnel junction in the forward direction. A forward bias is established by setting p-type tunnel junction layer 106 to a more positive voltage than n-type tunnel junction layer 104. The width of depletion region 204 decreases under forward bias (not shown).

A reverse bias applied across tunnel junction 110 adds to the height of the built-in potential barrier and increases the width of depletion region 204 to W'. The reverse bias separates the Fermi levels $E_{Fn}$ and $E_{Fp}$ on opposite sides of the tunnel junction. In the example shown, the Fermi level $E_{Fp}$ of the material of p-type tunnel junction layer 106 has increased relative to its equilibrium level, whereas the Fermi level $E_{Fn}$ of the material of n-type tunnel junction layer 104 remains substantially unchanged. In a conventional p-n junction, only a small leakage current flows across the junction under reverse bias. However, in tunnel junction 110, the reverse bias causes current to flow and occurs due to electrons tunneling through the potential barrier.

The reverse bias elevates the valence band energy $E_{V_p}$ of the material of p-type tunnel junction layer 106 above the conduction band energy $E_{C_n}$ of the material of n-type tunnel junction layer 104. This allows electrons in the valence band of the material of the p-type tunnel junction layer to tunnel through the potential barrier to unoccupied sites in the conduction band of the material of n-type tunnel junction layer 104, as shown schematically in FIG. 2B. The greater the reverse bias applied across tunnel junction 110, the higher the probability that an electron, e⁻, will tunnel across tunnel junction 110, and the higher the conduction through the tunnel junction.

In a conventional tunnel junction structure 112, the semiconductor materials of tunnel junction layers 104 and 106 have a relatively large band-gap energy difference. Such materials establish a relatively high potential barrier at tunnel junction 110. The reverse bias that has to be applied across the tunnel junction structure to cause a tunneling current on the order of the laser current of a laser diode to flow is therefore relatively large. Such a tunnel junction can therefore be regarded as having a high voltage drop, which is undesirable in many applications. The voltage drop of a tunnel junction structure can be reduced by reducing the width of the depletion region to increase the tunneling probability. This approach is conventionally used to reduce the voltage drop by doping the tunnel junction layers to as high a concentration as possible.

Materials with a low band-gap may be used as the semiconductor materials of n-type tunnel junction layer 104 and p-type tunnel junction layer 106 to reduce the doping concentrations necessary to achieve a given conductivity. Low band-gap materials, such as GaInAs, $E_g=0.75$ eV), have been used in InP-based devices, i.e., semiconductor devices with substrates of indium phosphide, to achieve a relatively high tunnel-junction conductivity. Low bandgap materials are also available in GaAs-based devices. However, doping concentrations sufficient to ensure a high probability of tunneling are difficult to achieve in these materials.

The addition of N to the n-type tunnel junction layer lowers the bandgap of the tunnel junction layer and improves the tunneling probability.

Prior U.S. patent application Ser. No. 10/243,520 discloses a tunnel junction structure in which a fraction of the arsenic atoms in the semiconductor material of the p-type tunnel junction layer are replaced with antimony atoms, thus increasing the valence band energy of the p-type material. The tunnel junction structure of prior application Ser. No. 10/243,520 also discloses replacing a fraction of the arsenic atoms in the semiconductor material of the n-type tunnel junction layer with nitrogen atoms, thus decreasing the conduction band energy of the n-type material. Increasing the valence band energy of the semiconductor material of the p-type tunnel junction layer and decreasing the conduction band energy of the semiconductor material of the n-type tunnel junction layer increase the probability of tunneling occurring at a given reverse bias applied across the tunnel junction. Unfortunately, when nitrogen is added to the material of the n-type tunnel junction layer, the reduction in the voltage drop across the tunnel junction is less than predicted.

Thus, what is needed is a tunnel junction structure that can be fabricated using the GaAs material system in which the tunneling probability is increased and, hence, the conductivity of the tunnel junction structure is increased and the voltage drop across the tunnel junction is reduced.

SUMMARY OF THE INVENTION

The invention provides a tunnel junction structure that comprises an n-type tunnel junction layer of a first semiconductor material, a p-type tunnel junction layer of a second semiconductor material and a tunnel junction between the tunnel junction layers. The first semiconductor material includes gallium (Ga), arsenic (As) and nitrogen (N), and a Group VI dopant.

The invention also provides a light-emitting device that comprises an active region configured to generate light in response to injected charge and a tunnel junction structure located to inject charge into the active region. The tunnel junction structure includes an n-type tunnel junction layer of a first semiconductor material, a p-type tunnel junction layer of a second semiconductor material and a tunnel junction between the tunnel junction layers. The first semiconductor material includes gallium, arsenic, nitrogen, and a Group VI dopant.

The invention additionally provides a method of making a tunnel junction structure. In the method, a substrate is provided. An n-type tunnel junction layer of a first semiconductor material including gallium, arsenic, nitrogen, and a Group-VI dopant is formed over the substrate. A p-type tunnel junction layer of a second semiconductor material is juxtaposed with the n-type tunnel junction layer to form the tunnel junction.

Finally, the invention provides a method for generating light. In the method, an optical cavity is formed and an active region is located in the optical cavity. The active region is configured to generate light in response to injected current. A tunnel junction structure is formed located to inject charge into the active region, and current is injected into the active region using the tunnel junction structure. The tunnel junction structure is formed by forming an n-type tunnel junction layer of a first semiconductor material including gallium, arsenic, nitrogen, and a Group VI dopant and forming a p-type tunnel junction layer of a second semiconductor material. The p-type tunnel junction layer is juxtaposed with the n-type tunnel junction layer to create a tunnel junction.

The voltage drop of the tunnel junction is lowered by forming the tunnel junction structure of a p-type tunnel junction layer and an n-type tunnel junction layer of semiconductor materials selected to have a reduced difference between the valence band energy of the material of the p-type tunnel junction layer and the conduction band energy of the material of the n-type tunnel junction layer. Reducing the energy difference between the valence band energy of the material of the p-type tunnel junction layer and the conduction band energy of the material of the n-type tunnel junction layer increases the tunneling probability at a given reverse bias, and, hence, reduces the voltage drop across the tunnel junction for a given current through the tunnel junction. The difference between the valence band energy of the material of the p-type tunnel junction layer and the conduction band energy of the material of the n-type tunnel junction layer is reduced by adding nitrogen to the gallium arsenide of the n-type tunnel junction layer. The invention eliminates mutual passivation between the nitrogen and the n-type dopant used to dope the material of the n-type tunnel junction layer by doping the material of the n-type tunnel junction layer with a Group VI dopant, such as sulfur (S), selenium (Se), or tellurium (Te). The high active dopant concentration achievable using a group VI dopant further increases the tunneling probability, and reduces the voltage drop across the tunnel junction. In embodiments in which indium (In), antimony (Sb), or bismuth (Bi) is present in the p-type tunnel junction layer, the addition of N to the n-type tunnel junction layer allows the amount of In, Sb, and/or Bi to be increased. This has the effect of increasing the valence band edge in the p-type tunnel junction layer.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF THE INVENTION

The invention is based on the realization that the less-than-predicted reduction in the voltage drop across the tunnel junction resulting from adding N to the semiconductor material of the n-type tunnel junction layer is the result of an inadequate concentration of active dopant atoms in the material of the n-type tunnel junction layer. Silicon it typically used as an n-type dopant in Group III–V materials, but a high active dopant concentration is difficult to obtain with this dopant. In a layer of Si-doped GaAs grown by MOCVD, the maximum active dopant concentration practically obtainable is a few times $10^{18}$ atoms/cc. This dopant concentration is marginally acceptable in a tunnel junction layer. When nitrogen is added to GaAs as described above, mutual passivation between N and Si reduces the concentration of active dopant atoms. The reduced effective doping concentration gives rise to the less-than-predicted reduction in the voltage drop resulting from adding N to the material of the n-type tunnel junction layer.

The invention provides a tunnel junction structure in which the probability of tunneling is significantly increased by forming the tunnel junction structure of materials having a reduced energy difference between the valence band of the material of the p-type tunnel junction layer and the conduction band of the n-type tunnel junction layer. Specifically, the energy difference between the valence band of the material of the p-type tunnel junction layer and the conduction band of the n-type tunnel junction layer is reduced by adding N to the material of the n-type tunnel junction layer. The invention overcomes the problem of the lower-than-expected voltage drop across the tunnel junction caused by adding N to the material of the n-type tunnel junction layer doped with a conventional n-type dopant such as Si in which Si and N mutually passivate. The invention overcomes this problem by forming the n-type tunnel junction layer of a semiconductor material that includes Ga, As, N and doping this material with a Group VI dopant, such as sulfur (S), selenium (Se) or tellurium (Te). Using a Group VI n-type dopant eliminates mutual passivation that occurs with a Group-IV dopant, such as silicon (Si). Accordingly, the performance disadvantages and mutual passivation that stem from using Si to dope a N-containing semiconductor material are avoided because N and a Group VI dopant do not mutually passivate The reduced energy difference and the higher doping concentration resulting from the Group VI n-type dopant create a high tunneling probability and a consequent low voltage drop. The p-type tunnel junction layer can include antimony, bismuth, nitrogen, or indium.

Figure 1:
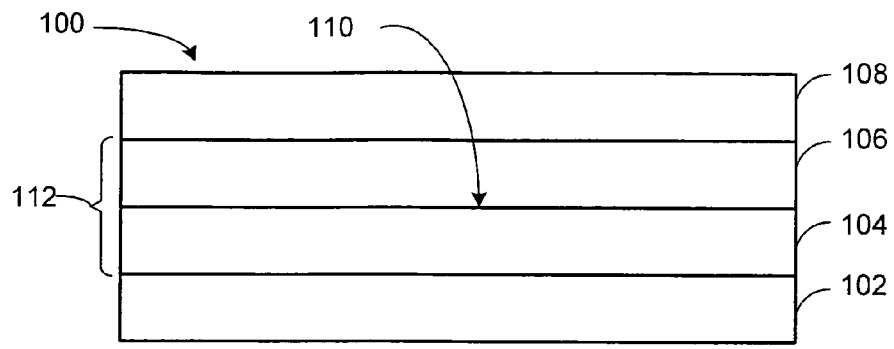
FIG. 1 is a schematic side view of a prior-art semiconductor device incorporating a tunnel junction structure.
Figure 2A:
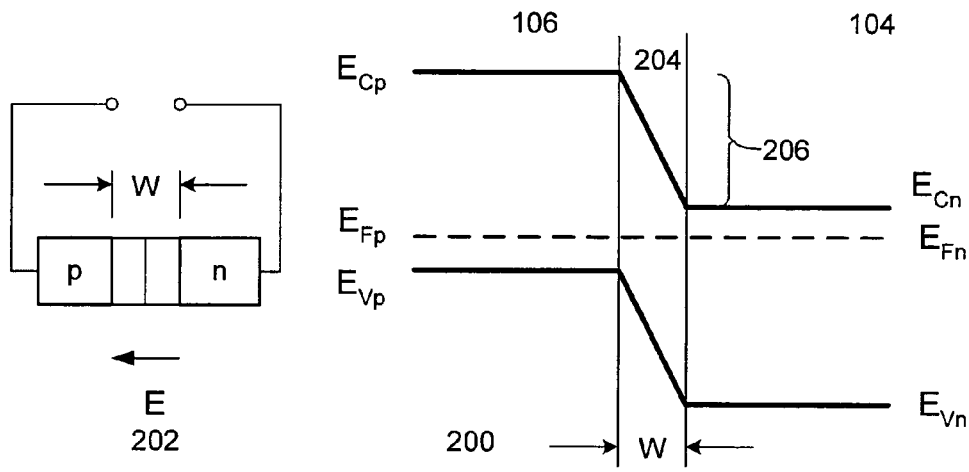
FIGS. 2A and 2B are circuit schematics and associated energy band diagrams illustrating characteristics of a tunnel junction structure at equilibrium and under reverse bias, respectively.
Figure 2B:
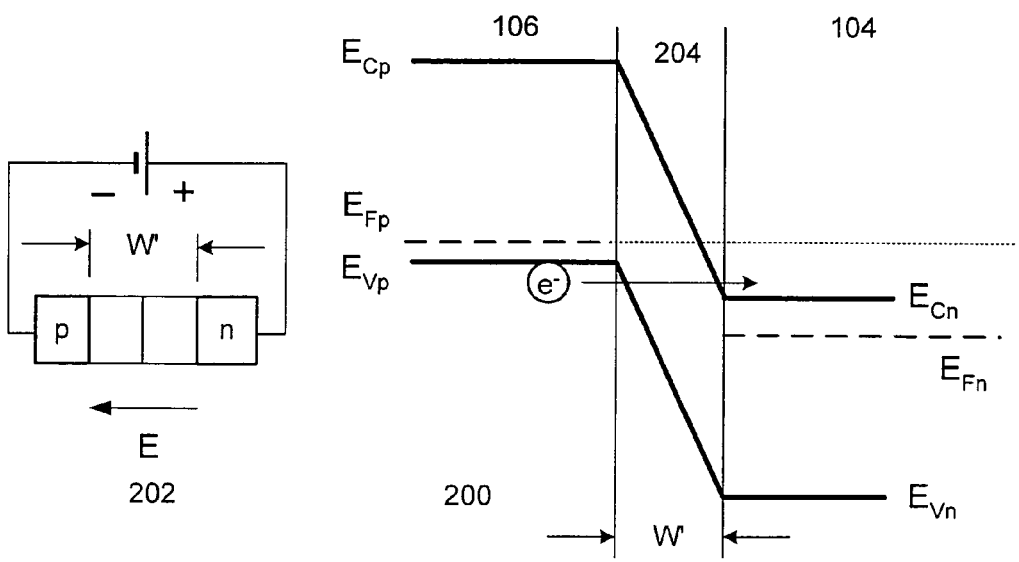
Figure 3:
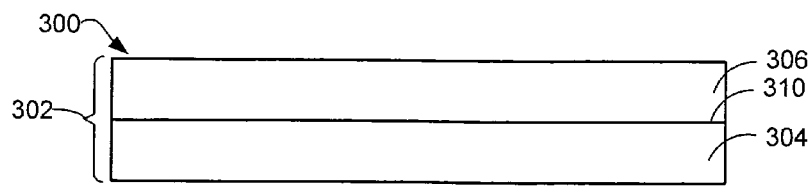
FIG. 3 is a schematic side view of a tunnel junction structure according to the invention.

FIG. 3 is a schematic side view of a semiconductor device 300 incorporating a tunnel junction structure 302 according to the invention. Tunnel junction structure 302 is composed of an n-type tunnel junction layer 304, a p-type tunnel junction layer 306 and a tunnel junction 310 between the tunnel junction layers. The n-type tunnel junction layer 304 is a layer of an n-type semiconductor material. The p-type tunnel junction layer is a layer of a p-type semiconductor material. The semiconductor material of the n-type tunnel junction layer 304 includes gallium, arsenic and nitrogen, and may also include indium. Specifically, the semiconductor material of the p-type tunnel junction layer includes gallium, arsenic, and possibly antimony, bismuth, nitrogen or indium. The semiconductor material of the n-type tunnel junction layer includes gallium, arsenic, nitrogen, and possibly indium. The semiconductor material of the n-type tunnel junction layer 304 is doped using a Group VI dopant, such as S, Se or Te.

Replacing a fraction of the arsenic atoms with nitrogen atoms in the semiconductor material of n-type tunnel junction layer 304 decreases the conduction band energy of the material. Decreasing the conduction band energy of the semiconductor material of the n-type tunnel junction layer decreases the difference between the valence band energy of the material of p-type tunnel junction layer 306 and the conduction band energy of the material of n-type tunnel junction layer 304. However, adding N to the n-type tunnel junction layer 304 results in a voltage drop of the tunnel junction that is greater than predicted. The voltage drop across the tunnel junction is greater than predicted due to a lower than expected concentration of active dopant in the n-type tunnel junction layer 304 when this layer is conventionally doped using a Group IV material. When conventionally doped using a Group IV material such as Si, the N incorporated into the semiconductor material of the n-type tunnel junction layer 304 and the Si dopant mutually passivate each other. The result of the mutual passivation of the N and the Si is that the Si dopant reduces the desirable bandgap effect that the N has on the conduction band energy of the semiconductor material of the n-type tunnel junction layer.

The presence of N reduces the number of available free carriers provided by the Si. The mutual passivation occurs in Si-doped $GaN_xAs_{1-x}$ through the formation of nearest-neighbor $Si_{Ga}$—$N_{As}$ pairs when the samples are grown or annealed under conditions such that the diffusion length of Si is greater than or equal to the average distance between Si and N atoms. The formation of the nearest-neighbor $Si_{Ga}$—$N_{As}$ pairs eliminates the Si atom as an active donor and also eliminates the effect of the N on the bandgap. Thus, a heavily Si-doped semiconductor material suffers an undesirable increase in conduction band energy due to the deactivation of the N by the Si.

Using a Group VI dopant, such as S, Se or Te for the semiconductor material of the n-type tunnel junction layer 304 eliminates mutual passivation between the N and the n-type dopant because the N atoms and the Group VI atoms both occupy Group V atomic sites. An atom on a Group V site cannot form a nearest neighbor pair with another atom on a Group V site so there is no mutual passivation effect between N and a Group VI dopant. Doping the N-containing material of the n-type tunnel junction layer 304 with a Group VI dopant eliminates the mutual passivation between the N and the dopant. This results in a higher level of active dopant in the n-type material, which increases the probability of tunneling occurring at a given reverse bias voltage applied across the tunnel junction.

In one embodiment of tunnel junction structure 302, the semiconductor material of p-type tunnel junction layer 306 is p-type gallium arsenide antimonide (GaAsSb) and the semiconductor material of n-type tunnel junction layer 304 is n-type gallium nitride arsenide (GaNAs). The conduction band discontinuity between these materials at tunnel junction 310 ranges from about 0.2–0.4 eV. Although described in various embodiments using particular materials, the material of the p-type tunnel junction layer 306 may be any of the following: GaAs, GaInAs, GaAsSb GaInAsSb; GaNAsSb, GaInNAsSb, GaNAsBi, and GaInNAsBi and the material of the n-type tunnel junction layer 304 may be any of the following: GaNAs and GaInNAs. A tunnel junction structure may be grown using these materials on or over a substrate of gallium arsenide or indium phosphide.

The Sb fraction in the semiconductor material of the p-type tunnel junction layer 306 is chosen to provide a band gap at which light absorption is negligible in the light-emitting device in which tunnel junction structure 302 is incorporated. An Sb fraction of less than approximately 0.31 gives negligible light absorption in light-emitting devices that generate light in the 1.3 μm wavelength range and an Sb fraction less than approximately 0.47 gives negligible light absorption in light-emitting devices that generate light in the 1.55 μm wavelength range. Again, the compositions of the materials of the tunnel junction layers can be formulated to minimize light absorption and to maintain a small band-gap energy difference between the layers to provide a high tunneling probability. In addition, light absorption can be minimized by locating the tunnel junction at a null in the electromagnetic field in the light-emitting device. Regardless of the method chosen for reducing light absorption, the thickness of the layers is made smaller than the critical thickness to achieve good crystalline and, hence, good optical quality.

Figures 4A, 4B:
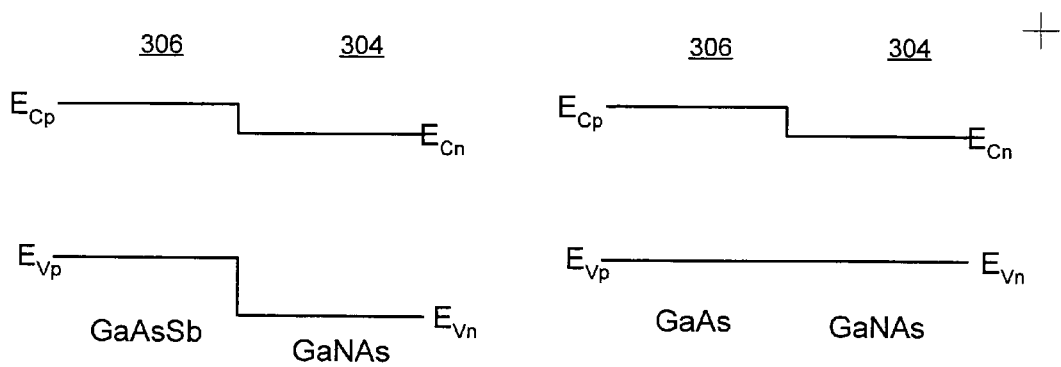
FIG. 4A is a graph illustrating the Type-II band alignment of a tunnel junction structure according to the invention in which the materials of the n-type and p-type tunnel junction layers are n-type GaNAs or n-type GaInNAs and p-type GaAsSb, respectively.
FIG. 4B is a graph illustrating the band alignment of a tunnel junction structure according to the invention in which the materials of the n-type and p-type tunnel junction layers are n-type GaNAs and p-type GaAs, respectively.

FIG. 4A shows the Type-II band alignment in an embodiment of tunnel junction structure 302 in which the material of p-type tunnel junction layer 306 is GaAsSb and that of n-type tunnel junction layer 304 is GaNAs or GaInNAs. This combination of materials has a Type-II band alignment in which the conduction band energy $E_{Cp}$ of the material of the p-type tunnel junction layer is greater than the conduction band energy $E_{Cn}$ of the material of the n-type tunnel junction layer. Additionally, the valence band energy $E_{Vp}$ of the material of p-type tunnel junction layer is greater than the valence band energy $E_{Vn}$ of the material of the n-type tunnel junction layer. The Type-II band alignment reduces reverse-bias voltage required for significant electron tunneling to occur. A Type-II band alignment is achieved by selecting the compositions of the materials of the n-type and p-type tunnel junction layers 304 and 306, respectively. The compositions of the materials of the tunnel junction layers may additionally be selected to minimize light absorption and to provide a low band-gap energy difference. Adding N to the material of the p-type tunnel junction layer 306 allows the incorporation of additional Sb, Bi, or In, thus further raising the valence band energy of the p-type material.

In an embodiment, the material of n-type tunnel junction layer 304 is n-type gallium nitride arsenide (GaNAs). Substituting a small fraction of the arsenic atoms in GaAs with nitrogen atoms significantly reduces the band gap energy of the material. Most of the reduction in the band gap energy is the result of a reduction in the conduction band energy. As an example, substituting 1% of the arsenic atoms with nitrogen atoms reduces the conduction band energy by about 180 meV.

In another embodiment, the material of n-type tunnel junction layer 304 is $Ga_{1-w}In_wN_xAs_{1-x}$ in which $w \leq 0.4$ and $x \leq 0.15$ and the material of p-type tunnel junction layer 306 is $GaN_yAs_{1-y-z}Sb_z$ in which $y \leq 0.15$ and $z < 0.3$. In some of these embodiments, for example, ones in which materials of the n-type and p-type tunnel junction layers are GaNAs (w=0) and GaAs (y=0, z=0), respectively, the materials of the n-type tunnel junction layer and the p-type tunnel junction layer have the same valence band energy but differ in their conduction band energies.

FIG. 4B shows the band alignment in an embodiment of tunnel junction structure 302 in which the material of p-type tunnel junction layer 306 is GaAs and that of n-type tunnel junction layer 304 is GaNAs. The conduction band energy $E_{Cp}$ of the material of the p-type tunnel junction layer is greater than the conduction band energy $E_{Cn}$ of the material of the n-type tunnel junction layer, and the valence band energy $E_{Vp}$ of the material of p-type tunnel junction layer is approximately equal to the valence band energy $E_{Vn}$ of the material of the n-type tunnel junction layer. The band alignment shown in FIG. 4B is therefore not a strict Type-II band alignment. However, this band alignment produces the benefits described above.

Figures 4C, 4D:
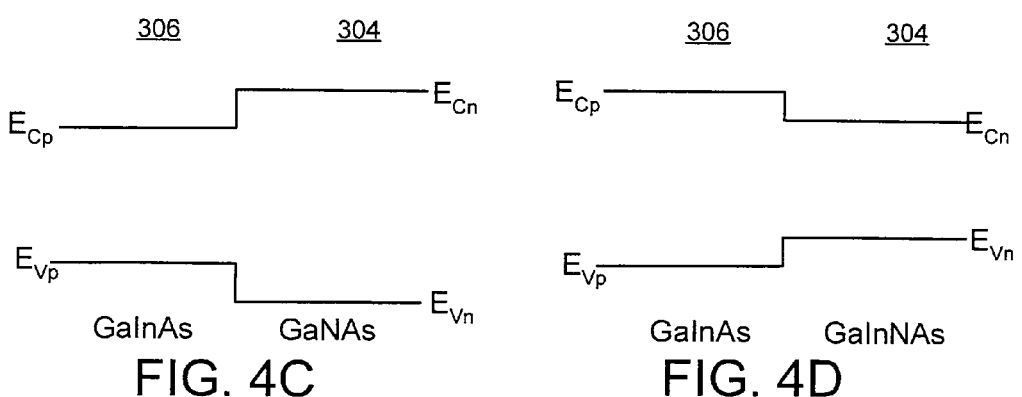
FIG. 4C is a graph illustrating the band alignment of a tunnel junction structure according to the invention in which the materials of the n-type and p-type tunnel junction layers are n-type GaNAs and p-type GaInAs, respectively.
FIG. 4D is a graph illustrating the band alignment of a tunnel junction structure according to the invention in which the materials of the n-type and p-type tunnel junction layers are n-type GaInNAs and p-type GaInAs, respectively.

FIG. 4C shows the effect of replacing a fraction of the gallium atoms in the GaAs of p-type tunnel junction layer 306 with indium atoms on the band alignment shown in FIG. 4B. Replacing a fraction of the gallium atoms in GaAs with indium atoms increases the valence band energy and reduces the conduction band energy relative to GaAs. Therefore, the conduction band energy $E_{Cp}$ of the material of the p-type tunnel junction layer is less than the conduction band energy $E_{Cn}$ of the material of the n-type tunnel junction layer, and the valence band energy $E_{Vp}$ of the material of p-type tunnel junction layer is greater than the valence band energy $E_{Vn}$ of the material of the n-type tunnel junction layer. The energy-band alignment shown reduces reverse-bias voltage required for significant electron tunneling to occur.

FIG. 4D shows the effect of replacing a fraction of the gallium atoms in the GaNAs of n-type tunnel junction layer 304 with indium atoms on the band alignment shown in FIG. 4C. The fraction of indium atoms in n-type tunnel junction layer 304 is greater than the fraction of indium atoms in p-type tunnel junction layer 306. Replacing a fraction of the gallium atoms in the GaNAs of the n-type tunnel junction layer with indium atoms increases the valence band energy and reduces the conduction band energy relative to GaNAs. Therefore, the conduction band energy $E_{Cp}$ of the material of the p-type tunnel junction layer is greater than the conduction band energy $E_{Cn}$ of the material of the n-type tunnel junction layer, and the valence band energy $E_{Vp}$ of the material of p-type tunnel junction layer is less than the valence band energy $E_{Vn}$ of the material of the n-type tunnel junction layer. The energy-band alignment shown reduces reverse-bias voltage required for significant electron tunneling to occur. An embodiment in which the fraction of indium atoms in n-type tunnel junction layer 304 is less than the fraction of indium atoms in p-type tunnel junction layer 306 has a Type-II band alignment similar to that shown in FIG. 4A.

In accordance with the invention, the n-type tunnel junction layer 304 containing N is doped using a Group VI element, such as S, Se, or Te. Using a Group VI element as the n-type dopant for the n-type tunnel junction layer 304 allows active donor concentrations in the semiconductor material of the n-type tunnel junction layer 304 in excess of $10^{19}$ cm$^{-3}$. Such doping concentration can be achieved when using MOCVD to fabricate the tunnel junction layers. Furthermore, rather than being electrically passivated by N, the activation of the Se is enhanced in the presence of N. Active donor concentrations in the mid-high $10^{19}$ cm$^{-3}$ range are possible.

Figure 5:
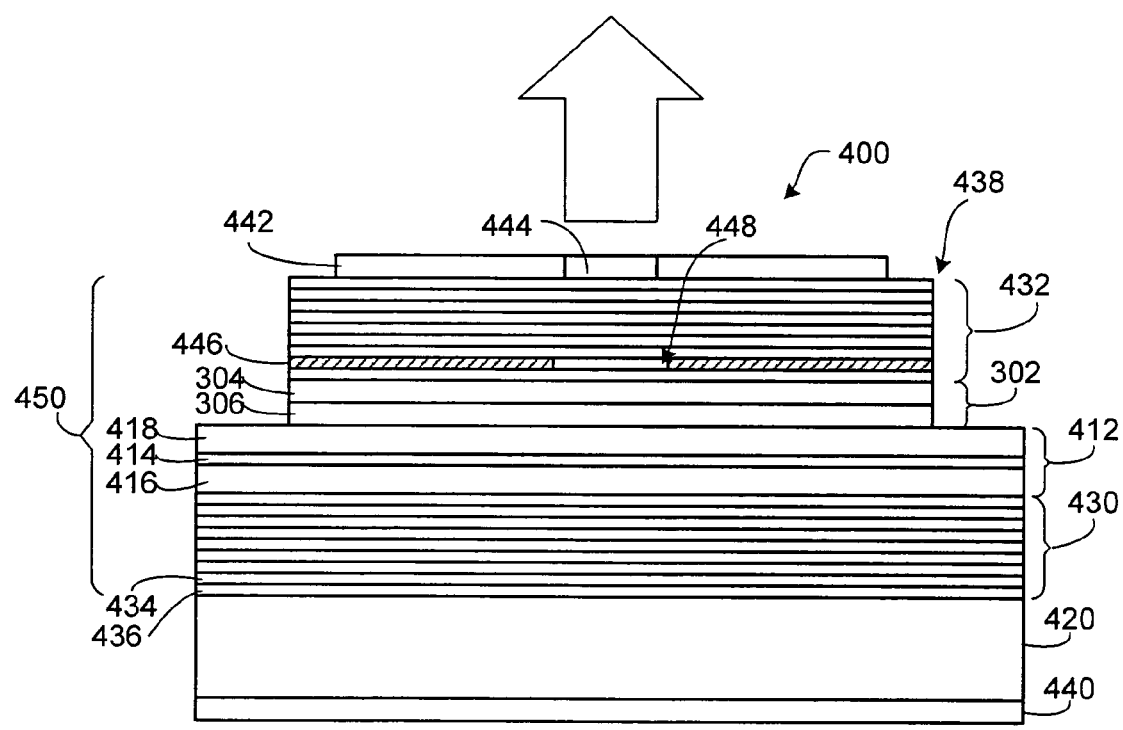
FIG. 5 is a schematic side view of a first embodiment of a vertical-cavity surface-emitting laser according to the invention.

Two exemplary light-emitting devices incorporating the tunnel junction structure of the invention will now be described with reference to FIGS. 5 and 6. FIG. 5 is a schematic side view of a VCSEL 400 composed of a substrate-side distributed Bragg reflector (DBR) 430, an active layer 412, tunnel junction structure 302 and a remote-side DBR 432, epitaxially grown, in order, on a substrate 420. In a preferred embodiment, the semiconductor material of the substrate is single-crystal gallium arsenide. The structure shown in FIG. 5 may alternatively be grown with changes to the materials of some of the layers on an InP substrate.

Each of DBRs 430 and 432 is composed of multiple layer pairs. Each layer pair is composed of a layer of a high refractive index material and a layer of a low refractive index material. The materials of the layers are optically transparent at the wavelength of the light generated in active region 412. Exemplary layer 434 of higher refractive index material and layer 436 of lower refractive index material constituting an exemplary layer pair of substrate-side DBR 430 are shown. Each layer has a thickness equal to one-quarter of the wavelength of the light generated in active region 412 in the material of the layer, i.e., $t_b=\lambda/4n_b$, where $t_b$ is the thickness of the layer, $\lambda$ is the in vacuo wavelength of the light generated in the active region and $n_b$ is the refractive index of the material of the layer.

In the example shown, both DBR 430 and DBR 432 are fabricated of doped semiconductor materials and are therefore electrically conductive. In embodiments incorporating non-conductive DBRs, such DBRs may be fabricated from dielectric materials. Also in the example shown, the lower refractive index semiconductor material of layer 436 is aluminum gallium arsenide and the higher refractive index semiconductor material of layer 434 is gallium arsenide. The number of layer pairs shown in FIG. 5 is substantially reduced to simplify the drawing. In a working VCSEL, the number of layer pairs is sufficient to provide substrate-side DBR 430 and remote-side DBR 432 with a reflectivity of greater than about 99% and of about 95%, respectively, at the wavelength of the light generated in active region 412. Also, in addition to the layer pairs, each of the DBRs is composed of an additional layer of low refractive index material.

Active layer 412 is composed of quantum-well structure 414 sandwiched between the substrate-side cladding layer 416 and the remote-side cladding layer 418. The quantum-well structure is composed of at least one quantum-well layer (not shown) sandwiched between respective barrier layers (not shown) of a material different from that of the quantum well layer. No dopants are added to the materials of the active layer when the active layer is grown.

Substrate-side cladding layer 416 and the remote-side cladding layer 418 are layers of aluminum gallium arsenide (AlGaAs) with an aluminum fraction in the range from about 0.2 to about 0.8, i.e., ~0.2≤x≤~0.8 in $Al_xGa_{1-x}As$. A typical value of x is about 0.4. The cladding layers each have a minimum thickness corresponding to one wavelength of the light generated in quantum-well structure 414 in the material of the cladding layer, i.e., $t_c=\lambda/n_c$, where $t_c$ is the thickness of the cladding layer, $\lambda$ is the wavelength of the light generated in the quantum-well structure and $n_c$ is the refractive index of the AlGaAs of the cladding layer. The cladding layers are doped to have opposite conductivity types. The substrate-side cladding layer 416 is doped n-type and the remote-side cladding layer 418 is doped p-type.

In a conventional VCSEL, the semiconductor materials of the substrate-side DBR are doped n-type and those of the remote-side DBR are doped p-type, i.e., the materials of the DBRs have the same conductivity type as the adjacent cladding layers. The DBR fabricated of p-type materials has characteristics inferior to those of the DBR fabricated of n-type materials, as described above. However, tunnel junction structure 302 enables the semiconductor materials of both DBRs 430 and 432 to have the same conductivity type as one another, i.e., n-type, so that both DBRs have excellent optical and electrical characteristics.

Substrate-side DBR 430, active region 412, tunnel junction structure 302 and remote-side DBR 432 collectively form an optical cavity 450 that is resonant at the wavelength of the light generated in active layer 412.

In tunnel junction structure 302, p-type tunnel junction layer 306 is composed of GaAsSb and is grown on remote-side cladding layer 418. The n-type tunnel junction layer 304 is composed of GaNAs grown lattice matched or pseudomorphically on the p-type tunnel junction layer. Alternatively, p-type tunnel junction layer 306 may be composed of GaInAs and n-type tunnel junction layer 304 may be composed of GaInNAs grown on the p-type tunnel junction layer. The n-type tunnel junction layer 304 is doped using a Group VI element, such as S, Se, or Te, as described above.

After the layer structure composed of substrate 402, substrate-side DBR 430, active layer 412, tunnel junction structure 302 and remote-side DBR 432 has been fabricated, part of remote-side DBR 432 and part of tunnel junction structure 302 are etched away to form mesa 438. A current confinement structure is formed in the mesa. For example, ions may be selectively implanted into the mesa to decrease the conductivity of the mesa in all but a small, substantially central, conductive region. The conductivity of the mesa remains substantially unchanged in the conductive region.

In the example shown, however, the current-confinement structure is formed by exploiting the dependence of the oxidation rate of AlGaAs on the aluminum fraction of the AlGaAs. When remote-side DBR 432 is grown, at least one of the layers of AlGaAs is grown with an aluminum fraction substantially higher than that of the remaining layers of AlGaAs. For example, the high-aluminum fraction layer may have an aluminum fraction greater than about 0.9 when the remaining layers of AlGaAs have an aluminum fraction of in the range from about 0.75 to about 0.85. An exemplary high-aluminum fraction AlGaAs layer is shown at 446. After mesa 438 has been formed, the VCSEL is heated in an oxidizing atmosphere, such as an atmosphere with a high water vapor content. The oxidizing atmosphere oxidizes the exposed areas of all the layers of AlGaAs, the oxidation progressing radially inwards from the side of the mesa. However, oxidation progresses substantially faster in the high-aluminum fraction AlGaAs layer 446 than in the remaining AlGaAs layers. At the end of the oxidation process, almost all the high-aluminum fraction AlGaAs layer is oxidized to form a wide annular region of aluminum oxide surrounding a conductive region 448. Aluminum oxide has a substantially lower electrical conductivity than doped AlGaAs. The high-aluminum AlGaAs remains unoxidized in conductive region 448 so that the optical and electrical properties of the conductive region remain substantially unchanged. The remaining AlGaAs layers are oxidized only in a narrow annular region at their peripheries.

The area of the conductive region, e.g., 448, defined by ion implantation, oxidation or otherwise, is small compared with that of the mesa 438. During operation of the VCSEL 400, the laser current is confined to the conductive region, where it achieves a very high current density. The laser current enters active region 412 from the conductive region. Current spreading is relatively small so that the current density is also very high in the active region. The very high current density lowers the threshold current of the VCSEL. In an alternative embodiment, the oxide current confinement structure just described is located between tunnel junction structure 302 and active region 412.

A substrate-side contact layer 440, composed of at least one layer of metal, is deposited on the surface of the substrate 420 remote from substrate-side DBR 430. A remote-side contact layer 442 is deposited on the exposed surface of remote-side DBR 432 and is patterned to define a light exit port 444. The light exit port 444 is radially aligned with conductive region 448. The remote-side contact layer is composed of at least one layer of metal, and may additionally include at least one layer of n-type semiconductor material having a high dopant concentration to reduce the contact resistance between the metal layer and remote-side DBR 432.

Figure 6:
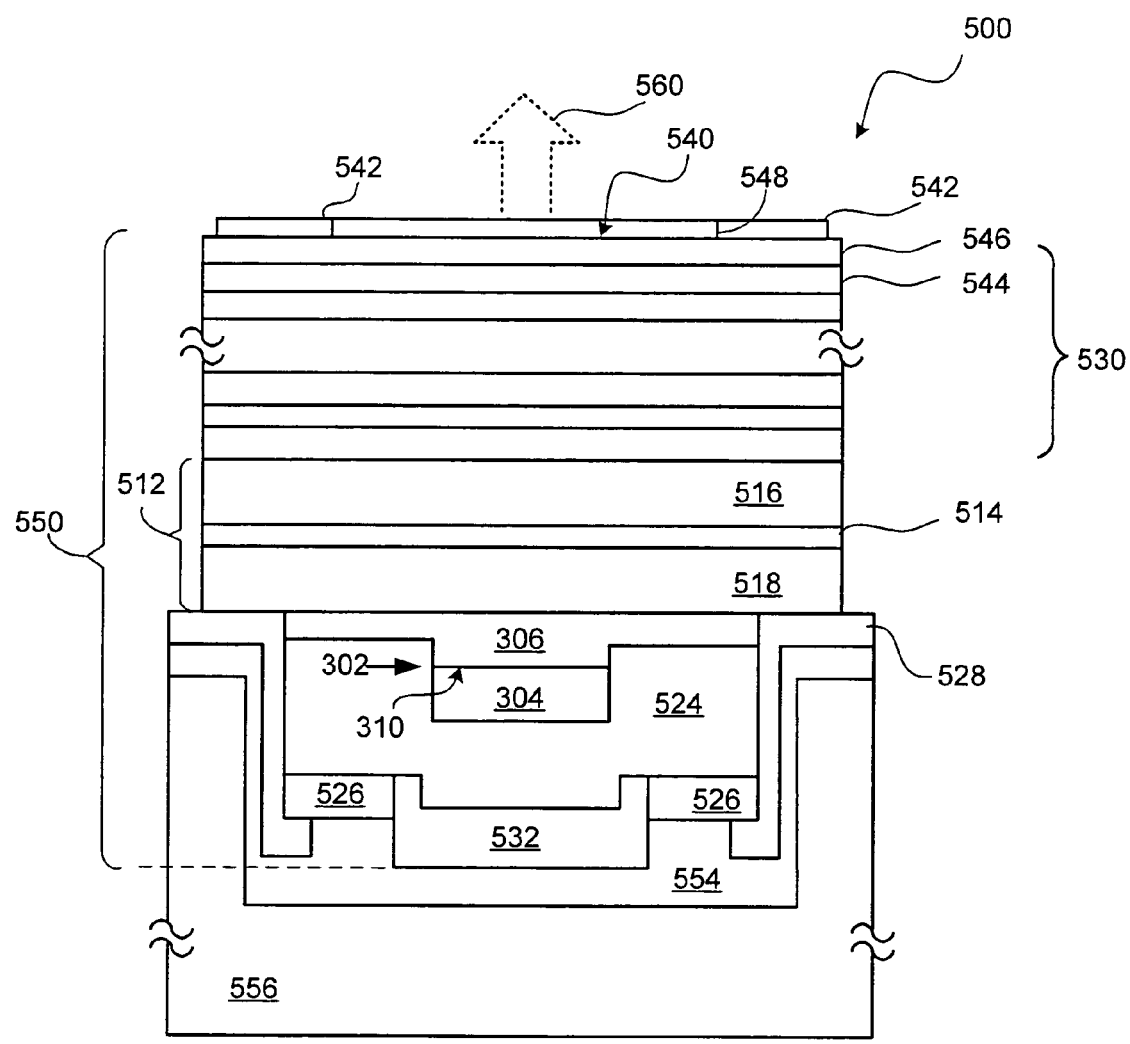
FIG. 6 is a schematic cross-sectional view of a second embodiment of a vertical-cavity surface-emitting laser according to the invention.

FIG. 6 is a schematic cross-sectional view of a second embodiment 500 of a VCSEL incorporating tunnel junction structure 302 according to the invention. VCSEL 500 emits light 560 from a surface 540 through an aperture 548 in a cathode contact 542. Tunnel junction structure 302 is structured to concentrate current and to inject carriers directly into the portion of active region 512 underlying aperture 548.

VCSEL 500 is composed of a semiconductor distributed Bragg reflector (DBR) 530, an active region 512, tunnel junction structure 302, a cap layer 524 and a dielectric DBR 532. Semiconductor DBR 530 is composed of pairs of layers of semiconductor materials having high and low refractive indices and an additional layer of the low refractive index semiconductor material. An exemplary layer pair composed of layer 544 and layer 546 is shown. Layer 544 is a layer of gallium arsenide (GaAs). Layer 546 is a layer of aluminum gallium arsenide (e.g., $Al_{0.90}Ga_{0.10}As$) or aluminum arsenide (AlAs). The thickness of each layer is equal to ¼ of the wavelength of the light generated in active region 512 divided by the refractive index of the material of the layer, as described above. The remaining layer pairs of semiconductor DBR 530 are similar. The materials of semiconductor DBR 530 are doped n-type. For example, the materials of semiconductor DBR 530 may be doped with silicon (Si) at a concentration of $2 \times 10^{18} cm^3$. Seventeen and one-half layer pairs of the materials described above give semiconductor DBR 530 a reflectivity of about 99.7%.

Active region 512 is composed of cladding layer 516, cladding layer 518 and quantum well region 514 sandwiched between the cladding layers. Cladding layer 516 is a layer of n-type aluminum gallium arsenide (AlGaAs). Quantum well region 514 is composed of compressively-strained (1.6%) quantum well layers separated by tensile-strained (0.4%) barrier layers. The quantum well layers are layers of gallium indium nitride arsenide (GaInNAs). Alternatively, region 514 may be formed from layers of GaAsSb or of a material with integrated quantum dots. Cladding layer 518 is a layer of p-type AlGaAs.

Tunnel junction structure 302 is located between cladding layer 518 and cap layer 524. Tunnel junction 310 is positioned at a minimum of the electromagnetic field intensity distribution in VCSEL 500 to minimize light absorption by tunnel junction structure 302. In the example shown, the material of p-type tunnel junction layer 306 is GaAsSb and the material of n-type tunnel junction layer is GaInNAs. The n-type tunnel junction layer 304 and the p-type tunnel junction layer 306 form tunnel junction 310. The antimony fraction of the material of the p-type tunnel junction layer is <0.3 The GaAsSb and GaInNAs that constitute the tunnel junction layers of tunnel junction structure 302 have a Type-II band alignment.

In the example shown, tunnel junction 310 has an area substantially less than that of quantum well region 514; p-type tunnel junction layer 306 is located adjacent cladding layer 518; n-type tunnel junction layer 304 and part of p-type tunnel junction layer 306 are located adjacent cap layer 524. The material of cap layer 524 is n-type having a dopant concentration substantially less than that of n-type tunnel junction layer. Consequently, most of the current flowing from cap layer 524 to p-type tunnel junction layer 306 flows through n-type tunnel junction layer 304. The current flows into the active region, where it remains concentrated in a region substantially corresponding to the area of tunnel junction 310. This provides a high current density in the portion of the active region underlying aperture 548.

Dielectric DBR 532 covers a part of cap layer 524 axially aligned with tunnel junction 310. In the example shown, the dielectric DBR is composed of a layer of silicon (Si) sandwiched between two layers magnesium fluoride ($MgF_2$). Dielectric DBR 532 has a reflectivity of approximately 99.5% as a result of the large refractive index contrast (approximately 1.9) between its constituent materials.

Contact layer 526, which contacts cap layer 524, surrounds dielectric DBR 532. The material of contact layer 526 is n-type InGaAs.

Insulating layer 528 covers an outer annular region of contact layer 526 radially separated from dielectric DBR 532 and covers the sides of the contact layer, cap layer 524 and p-type tunnel junction layer 306. The material of insulating layer 528 is silicon nitride ($Si_3N_4$).

Anode contact 554 covers dielectric mirror 532 and the exposed part of contact layer 526 not covered by insulating layer 528. The anode contact additionally covers insulating layer 528. Thus, anode contact 554 makes electrical contact with contact layer 526. The material of anode contact is gold (Au).

Cathode contact 542, also of gold, covers an annular region on surface 540 of semiconductor DBR 530. Defined in cathode contract 542 is aperture 548 through which light generated in active region 512 is emitted.

VCSEL 500 is shown mounted in heatsink 556. The material of heatsink 556 is silver (Ag).

VCSEL 500 is fabricated by first epitaxially growing on a GaAs wafer a layer structure from which many VCSELs, including VCSEL 500, are made. The layer structure is grown by MOCVD. Other suitable growth processes may alternatively be used. Layers corresponding to semiconductor DBR 530, n-type cladding layer 516, quantum well region 514, p-type cladding region 518, p-type tunnel junction layer 306 and n-type tunnel junction layer 304 of VCSEL 500 are grown, in order, on the wafer. For convenience, the layers of the layer structure will be called by the names of the corresponding layers of VCSEL 500. The n-type tunnel junction layer is grown at a growth temperature in the range from 500° C.–600° C. As no aluminum precursor is used to grow this layer, the oxygen level in the layer can be as low as $10^{16}$ $cm^{-3}$.

The layer structure is then removed from the reactor, and a mask that defines the shape of n-type tunnel junction layer 304 of each VCSEL is applied to the exposed surface of the n-type tunnel junction layer. An etch process is performed using an etchant that etches the material of not only the n-type tunnel junction layer not protected by the mask but also the material of p-type tunnel junction layer 306 exposed by removal of the n-type tunnel junction layer. The etching process is timed such that only part of p-type tunnel junction layer is removed.

The layer structure is then returned to the reactor and cap layer 524 is regrown over the contoured surface of tunnel junction structure 302. The layers constituting dielectric DBR 532 are then deposited over cap layer 524.

The layer structure is then removed from the reactor, a mask is applied to the surface of the exposed surface of the dielectric DBR and the parts of the dielectric DBR not protected by the mask are etched until the underlying parts of the surface of cap layer 524 are exposed.

The layer structure is then returned to the reactor and contact layer 526 is regrown over the contoured surfaces of dielectric DBR 532 and cap layer 524.

The layer structure is then removed from the reactor, a mask is applied to the surface of the contact layer and the parts of the contact layer not protected by the mask are etched until the underlying parts of the surface of dielectric mirror 532 are exposed.

The layer structure is placed in a nitride deposition reactor and silicon nitride is deposited over the contoured surface of the layer structure to form insulating layer 528. The layer structure is then removed from the reactor, a mask is applied to the exposed surface of the insulating layer and the parts of the insulating layer not protected by the mask are etched until the underlying parts of the surface of contact layer 526 are exposed.

The layer structure is etched to remove the GaAs wafer. This exposes surface 540 of semiconductor DBR 530. The layer structure is placed in a metallization reactor, and a layer of gold is deposited on the exposed surfaces of contact layer 526 and passivation layer 528 to form anode contact 554 and on surface 540 to form a cathode contact layer. A mask is applied to the surface of the cathode contact layer and the parts of the cathode contact layer not protected by the mask are etched until the underlying parts of surface 540 are exposed. This defines the shape of cathode contact 542.

Finally, the layer structure is divided into individual VCSELs, including VCSEL 500. Each individual VCSEL may then be mounted in a heatsink, such as heatsink 556. More details of the above fabrication method can be found in Ortsiefer et al., *Low-Resistance InGa(Al)As Tunnel Junctions for Long Wavelength Vertical-Cavity Surface-Emitting Lasers,* 39 JPN. J. APPL. PHYS., 1727–1729 (2000), the entire disclosure of which is incorporated by reference.

VCSEL 500 is operated by passing current from anode electrode 554 to cathode electrode 542. The current passes through contact layer 526, cap layer 524, tunnel junction structure 302, active region 512 and semiconductor DBR 530. The current passing into active region 512 is confined to an area underlying aperture 548. This area substantially corresponds to that of tunnel junction 310, as the lower doping concentration in cap layer 524 results in negligible tunneling current flowing between the cap layer and p-type tunnel junction layer 306.

The current causes active layer 512 to generate light. With the appropriate choice of materials and thicknesses, the light is generated at a wavelength in the wavelength range from 1.3 μm to 1.6 μm, which covers the ITU-standardized wavelengths for long- and medium-haul optical communication applications.

Tunnel junction structure 302 described above with reference to FIGS. 3–6 may be incorporated into other light-emitting devices, including light-emitting diodes and other lasers known in the art, such as, but not limited to, edge-emitting lasers, and in-plane emitting lasers. Tunnel junction structure 302 may also be incorporated into non light-emitting semiconductor devices such as tunnel diodes. A tunnel diode incorporating tunnel junction structure 302 has a very high negative differential resistance in the forward direction. This characteristic is desirable in such applications as oscillators, oscilloscope trigger circuits and solar cells.

An example of a method according to the invention for making a tunnel junction structure and for generating light will now be described below with reference to FIGS. 7 and 8. In the descriptions of the methods, it should be understood that although particular stages in the processes are described, alternative implementations are feasible. Moreover, some processes may be executed in an order different from that shown. For examples, processes may be executed substantially concurrently or in reverse order.

Figure 7:
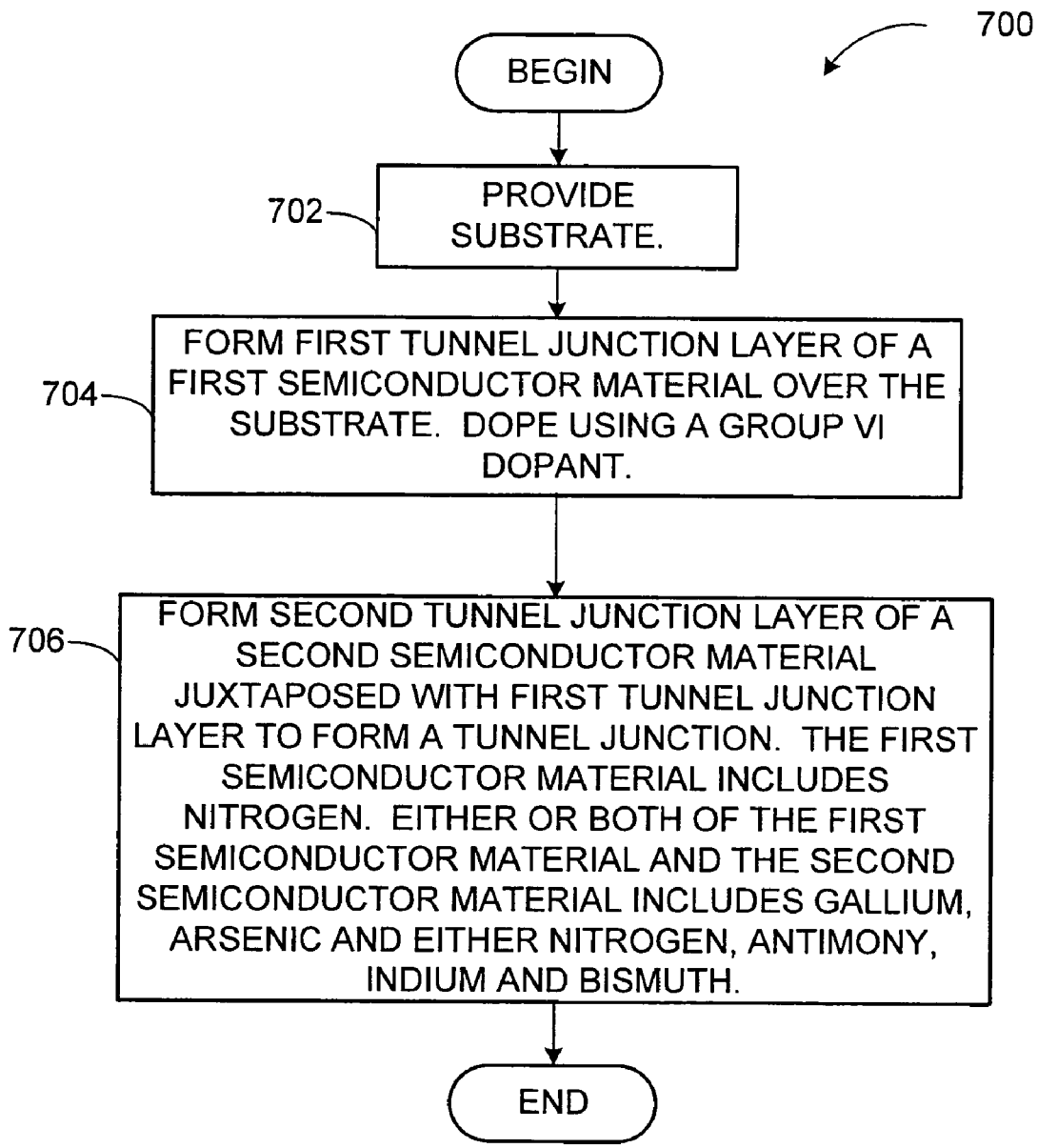
FIG. 7 is a flow chart illustrating a method according to the invention for making a tunnel junction structure.

FIG. 7 illustrates a method 700 according to the invention for making a tunnel junction structure. In block 702 a substrate is provided. In block 704, an n-type tunnel junction layer of a first semiconductor material is formed over the substrate. This can be accomplished by depositing a layer of the first semiconductor material over or on the substrate. The layer of the first semiconductor material is doped with a Group VI dopant, such as S, Se or Te. The dopant is supplied at the time that the layer is grown. When fabricated using MOCVD, gaseous, liquid or molecular compounds, such as hydrogen sulfide ($H_2S$), hydrogen selenide ($H_2Se$), diethyl and dimethyl telluride and other compounds are used as the precursor from which the Group VI dopant is obtained. When fabricated using MBE, solid elemental materials, such as PbTe, GaTe, and SnTe, are used as the precursor from which the Group VI dopant is obtained. Alternatively a portion of the substrate may be doped with a Group VI dopant to form the n-type tunnel junction layer.

In block 706, a p-type tunnel junction layer of a second semiconductor material is formed juxtaposed to the n-type tunnel junction layer. The n-type tunnel junction layer and the p-type tunnel junction layer collectively form a tunnel junction. The first semiconductor material includes nitrogen. Either or both of the first semiconductor material and the second semiconductor material includes gallium, arsenic, and either nitrogen, antimony, arsenic, bismuth and indium.

Either the n-type tunnel junction layer or the p-type tunnel junction layer can be grown lattice-matched or pseudomorphically or otherwise applied to the juxtaposed layer. Layers of additional materials may be grown or otherwise applied upon the tunnel junction layer remote from the substrate.

Figure 8:
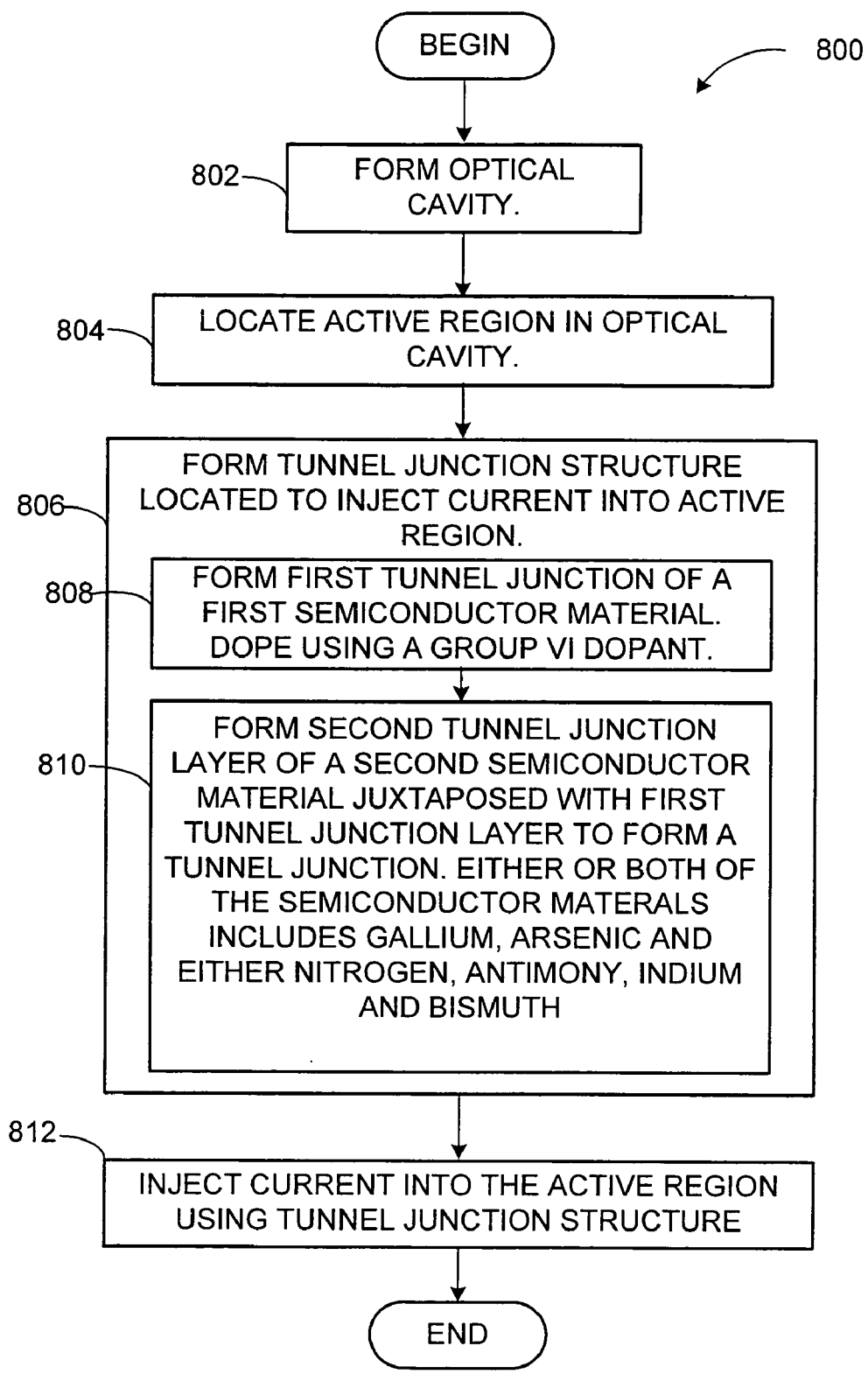
FIG. 8 is a flow chart illustrating a method according to the invention for generating light.

FIG. 8 illustrates a method 800 according to the invention for generating light. In block 802, an optical cavity is formed. In block 804, an active region is located in the optical cavity. In block 806, a tunnel junction structure is formed located to inject current into the active region. Block 806 includes blocks 808 and 810. In block 808, an n-type tunnel junction layer of a first semiconductor material is formed. The layer of the first semiconductor material is doped with a Group VI dopant, such as S, Se or Te. In block 810, a p-type tunnel junction layer of a second semiconductor material is formed juxtaposed with the n-type tunnel junction layer to form a tunnel junction. The first semiconductor material includes nitrogen. Either or both of the first semiconductor material and the second semiconductor material includes gallium, arsenic and either nitrogen, antimony, arsenic, bismuth and indium. In block 812, current is injected from the tunnel junction structure into the active region to cause the active region to generate light.

In the methods described above, the semiconductor material that includes gallium, arsenic and/or nitrogen, antimony, or indium is the material of the p-type tunnel junction layer. In an embodiment, the semiconductor material of the p-type tunnel junction layer includes gallium, arsenic and antimony and the semiconductor material of the n-type tunnel junction layer includes gallium, arsenic and nitrogen. The material of the n-type tunnel junction layer is doped with a Group VI dopant, such as S, Se, or Te.

This disclosure describes the invention in detail using illustrative embodiments. However, it is to be understood that the invention defined by the appended claims is not limited to the precise embodiments described.

We claim:

1. A light-emitting device, comprising:
    an active region configured to generate light in response to injected charge; and
    a tunnel junction structure located to inject charge into the active region and including an n-type tunnel junction layer of a first semiconductor material, a p-type tunnel junction layer of a second semiconductor material and a tunnel junction between the tunnel junction layers, the first semiconductor material including gallium (Ga), nitrogen (N), arsenic (As) and a Group VI dopant.

2. The light-emitting device of claim 1, in which the n-type tunnel junction layer is located between the p-type tunnel junction layer and the active region.

3. The light-emitting device of claim 1, in which the p-type tunnel junction layer is disposed between the n-type tunnel junction layer and the active region.

4. The light-emitting device of claim 1, in which the Group VI dopant is chosen from sulfur (S), selenium (Se) and tellurium (Te).

5. The light-emitting device of claim 4, in which the first semiconductor material consists essentially of gallium indium nitride arsenide $Ga_{1-x}In_xNAs$ in which $x \geq 0$.

6. The light-emitting device of claim 1, in which the second semiconductor material includes gallium, nitrogen, arsenic and antimony.

7. The light-emitting device of claim 5, in which:
    an electromagnetic field intensity distribution exists in the light-emitting device; and
    the tunnel junction is located at a minimum in the electromagnetic field intensity distribution.

8. The light-emitting device of claim 1, in which:
    the first semiconductor material consists essentially of gallium indium nitride arsenide GaInNAs; and
    the second semiconductor material consists essentially of gallium nitride arsenide antimonide GaNAsSb.

9. The light-emitting device of claim 8, in which:
    the first semiconductor material consists essentially of gallium indium nitride arsenide $Ga_{1-w}In_wN_xAs_{1-x}$, in which $w \leq 0.4$ and $x \leq 0.15$; and
    the second semiconductor material consists essentially of gallium nitride arsenide antimonide $GaN_yAs_{1-y-z}Sb_z$ in which $y \leq 0.15$ and $z \leq 0.3$.

10. The light-emitting device of claim 1, structured to generate light having a wavelength between 620 nm and 1650 nm.

11. The light-emitting device of claim 1, in which the second semiconductor material comprises at least one of indium, antimony and bismuth.

12. A method of making a tunnel junction structure, the method comprising:
    providing a substrate;
    forming over the substrate an n-type tunnel junction layer of a first semiconductor material, the first semiconductor material including gallium (Ga), nitrogen (N), arsenic (As) and a Group VI dopant; and forming over the substrate a p-type tunnel junction layer of a second semiconductor material juxtaposed with the n-type tunnel junction layer to form the tunnel junction.

13. The method of claim 12, in which:
the second semiconductor material comprises gallium and two or more of nitrogen, arsenic, antimony and bismuth; and
the method additionally comprises doping the second semiconductor material p-type.

14. The method of claim 12, further comprising:
doping the first semiconductor material n-type using a Group VI dopant chosen from sulfur (S), selenium (Se) and tellurium (Te).

15. A method for generating light, the method comprising:
forming an optical cavity;
locating an active region in the optical cavity, the active region configured to generate light in response to injected current;
forming a tunnel junction structure located to inject charge into the active region, including:
  forming an n-type tunnel junction layer of a first semiconductor material including gallium (Ga), nitrogen (N), arsenic (As) and a Group VI dopant and
  forming a p-type tunnel junction layer of a second semiconductor material juxtaposed with the n-type tunnel junction layer to create a tunnel junction; and
  injecting current into the active region using the tunnel-junction structure.

16. The method of claim 15, in which the active region is configured to generate light having a wavelength between 620 nm and 1650 nm.

17. The method of claim 15, in which the Group VI dopant is chosen from sulfur (S), selenium (Se) and tellurium (Te).

18. A tunnel junction structure, comprising:
an n-type tunnel junction layer of a first semiconductor material including gallium (Ga), nitrogen (N), arsenic (As) and a Group VI dopant;
a p-type tunnel junction layer of a second semiconductor material; and
a tunnel junction between the tunnel junction layers.

19. The tunnel junction structure of claim 18, in which the Group VI dopant is chosen from sulfur (S), selenium (Se) and tellurium (Te).

20. The tunnel junction structure of claim 18, in which the first semiconductor material consists essentially of gallium indium nitride arsenide $Ga_{1-x}In_xNAs$ in which $x \geq 0$.

21. The tunnel junction structure of claim 18, in which the second semiconductor material comprises gallium and two or more of nitrogen, arsenic, antimony and bismuth.

22. The tunnel junction structure of claim 18, in which:
the first semiconductor material consists essentially of gallium indium nitride arsenide (GaInNAs); and
the second semiconductor material consists essentially of gallium nitride arsenide antimonide (GaNAsSb).

23. The tunnel junction structure of claim 22, in which:
the first semiconductor material consists essentially of gallium indium nitride arsenide $Ga_{1-w}In_wN_xAS_{1-x}$, in which $w \leq 0.4$ and $x \leq 0.15$; and
the second semiconductor material consists essentially of gallium nitride arsenide antimonide $GaN_yAs_{1-y-z}Sb_z$ in which $y \leq 0.15$ and $z \leq 0.3$.

* * * * *